United States Patent [19]
Turner

[11] Patent Number: 5,672,974
[45] Date of Patent: Sep. 30, 1997

[54] RETURNED REFERENCE COMPATIBLE, STRAIGHTAWAY ENVELOPE DELAY MEASUREMENT INSTRUMENT AND METHOD

[75] Inventor: James F. Turner, McLean, Va.

[73] Assignee: Convex Corporation, Sterling, Va.

[21] Appl. No.: 588,317

[22] Filed: Jan. 18, 1996

[51] Int. Cl.[6] .............................. G01R 23/20; H04B 3/46
[52] U.S. Cl. ............................... 324/621; 324/617; 379/6
[58] Field of Search ..................................... 324/617, 621, 324/76.52, 76.53, 76.54, 615, 620; 379/5, 6, 28, 98, 21

[56] References Cited

U.S. PATENT DOCUMENTS

| | | | |
|---|---|---|---|
| 2,970,258 | 1/1961 | Sinclair | 324/621 |
| 3,629,696 | 12/1971 | Bartelink | 324/621 |
| 3,838,336 | 9/1974 | Aillet | 324/621 |
| 4,039,769 | 8/1977 | Bradley | 324/621 X |
| 4,220,914 | 9/1980 | Hekimian | 324/621 |
| 4,245,320 | 1/1981 | Desblache | 324/621 X |
| 4,301,536 | 11/1981 | Favin et al. | 324/621 X |
| 4,417,337 | 11/1983 | Favin et al. | 324/621 X |
| 5,123,286 | 6/1992 | Baumgartner | 324/617 X |
| 5,140,256 | 8/1992 | Hara | 324/76.12 |
| 5,397,992 | 3/1995 | Hill | 324/617 |
| 5,399,976 | 3/1995 | Wardle | 324/641 |

OTHER PUBLICATIONS

"Characteristics of an Impulsive–Noise Measuring Instrument . . . ", Specifications of Measuring Equipment, CCITT: The International Telegraph & Telephone Consultative Committee, Geneva, Nov. 10–21, 1980.

*Primary Examiner*—Ernest F. Karlsen
*Assistant Examiner*—Diep Do
*Attorney, Agent, or Firm*—James Creighton Wray

[57] ABSTRACT

A returned reference compatible straightaway envelope delay measuring instrument and a related method use a sinewave generator to produce an envelope and a low frequency reference oscillator for modulating amplitude of the envelope. The low frequency modulated envelope signal is transmitted over a transmission path to an envelope detector, which detects the envelope. A phase detector connected to the envelope detector and to a local similar low frequency reference oscillator detects phase difference between the low frequency modulating oscillation in the envelope and a local reference oscillator signal. A processor makes a series of delay measurements and computes the delay difference between the start delay measurement and the end delay measurement. The total delay difference, which represents the drift error between the envelope modulation oscillator and the local reference oscillator, is then separated out from the series of measurements taken between the start and end by subtracting from each measurement an appropriate portion of the total delay difference based on the proportion of time of each measurement to the total time.

22 Claims, 4 Drawing Sheets

RETURNED REFERENCE COMPATIBLE, STRAIGHTAWAY ENVELOPE DELAY MEASUREMENT INSTRUMENT AND METHOD

BACKGROUND OF THE INVENTION

The present invention applies to the fields of instrumentation and methods for measurement of delay in communications channels.

Envelope delay distortion is measured for communication channels, and particularly data carrying telephone lines, by placing a low frequency modulated envelope on a signal and by making measurements of the phase shift of the low frequency modulation.

A current measurement technique in the United States uses a separate reference path. Straightaway measurement techniques used overseas time share measure and reference carriers. Some straightaway envelope delay systems use 23 tone methods. None of the straightaway measurement systems is compatible with the returned reference measurement systems.

Needs exist for simplified measurement systems that are capable of straightaway application and which also may be used in a returned reference system.

SUMMARY OF THE INVENTION

The present invention improves on the returned reference method by providing accurate, end to end, envelope delay measurement capability on a straightaway basis, avoiding use of a second channel, and by providing measured data on a straightaway basis that is comparable to that of the 83⅓ Hz returned reference method.

The invention improves on the switched frequency method by achieving straightaway envelope delay measurements with substantially less complexity, by providing measured data that is comparable to that of the 83⅓ Hz returned reference method, and by providing a straightaway method that seamlessly reverts to the returned reference method.

The present invention improves on the 23 tone method by achieving straightaway envelope delay measurements with substantially less complexity, by providing measured data that is comparable to that of the 83⅓ Hz returned reference method, by providing a straightaway method that seamlessly reverts to the returned reference method, by achieving straightaway envelope delay measurements which are not limited to measuring at a fixed set of frequencies, and by achieving straightaway envelope delay measurements which are less susceptible to error in the presence of nonlinear distortion.

The new straightaway envelope delay measurement instrument of the present invention can be used in a returned reference configuration.

In the straightaway envelope delay measurement instrument, a signal generation unit includes a reference oscillator and a sinewave generator connected to an amplitude modulator. The delay measurement unit at a far point of the channel under test includes an envelope detector, a phase detector and a second reference oscillator connected to the phase detector. A reference oscillator difference correction processor is connected to the phase detector, and a measurement display is connected to the processor. The straightaway measurement system measures delay in a single channel using only the single channel.

In the returned reference measurement system, the signal generation unit is a reference remodulation unit, and an envelope detector replaces the first reference oscillator. A second channel is connected between the amplitude modulator in the delay measuring/reference generation unit and the envelope detector in the reference remodulation unit.

In the straightaway operation, the phase drift inherent between the two independent reference oscillators is measured, accounted for and separated out. An appropriate portion of the drift is subtracted from each measurement after the delay measuring unit has measured and stored a delay reading for each frequency.

The reference drift correction processor computes total delay difference and delay drift error for each measurement and offsets each measurement by the appropriate delay drift error.

A returned reference compatible straightaway envelope delay measuring instrument and method of the invention uses a sinewave generator to produce an envelope and a low frequency reference oscillator for modulating amplitude of the envelope. The low frequency modulated envelope signal is transmitted over a transmission path to an envelope detector, which detects the envelope. A phase detector connected to the envelope detector and to a local similar low frequency reference oscillator detects phase between the low frequency oscillation modulation in the envelope and the local reference oscillator signal. A processor makes a series of delay measurements and computes the delay difference between the start delay measurement and the end delay measurement, which have the sinewave generator set to the same frequency. The total delay difference, which represents the drift error between the envelope modulation signal and the local reference oscillator, is then separated out from the series of measurements taken between the start and end by subtracting from each measurement an appropriate portion of the total delay difference based on the proportion of time of each measurement to the total time, which is the time between the start and end measurements.

A preferred returned reference compatible, straightaway envelope delay measurement instrument has a reference oscillator and a variable frequency sinewave generator. An amplitude modulator is connected to the sinewave generator and the reference oscillator. The amplitude modulator is connected to the transmission path being measured. An envelope detector is connected to the transmission path remote from the amplitude modulator. A phase detector is connected to the envelope detector. A reference oscillator is connected to the phase detector. A reference oscillator difference error correction processor is connected to the phase detector, and a measurement display is connected to the processor.

The sinewave generator, the amplitude modulator connected to the sinewave generator and the reference oscillator connected to the amplitude modulator comprise a signal generation unit. The envelope detector, the phase detector, the reference oscillator, the reference oscillator difference error correction processor and the measurement display comprise a delay measuring unit.

When the instrument is operated in the returned reference mode of FIG. 4, it is not necessary to deploy the "start-end" strategy of FIG. 5 since there is zero delay drift error due to use of a single low frequency reference oscillator.

A reference remodulation unit has a second sinewave generator. A second envelope detector is connected over a return line to the amplitude modulator, and a second amplitude modulator is connected to the second envelope detector. The amplitude modulators and the envelope detectors are connected via transmission pathways.

In one embodiment, the delay measuring unit and reference generation unit are mounted together. The reference oscillator is connected to the phase detector and the reference oscillator connected to the amplitude modulator is the same reference oscillator.

The signal generation unit is connected to a first end of the transmission pathway and the envelope detector is connected to the second end of the transmission pathway.

A preferred method of delay measurement includes creating a sinewave signal in a sinewave generator. A low frequency reference signal is created in a low frequency reference oscillator. The sinewave signal is modulated with the low frequency oscillation. The modulated sinewave signal is provided on a transmission path. The modulated sinewave signal is detected with an envelope detector in a delay measuring unit. A second low frequency oscillation signal is provided. Phase is detected between the first low frequency oscillation signal from the envelope detector and the second low frequency oscillation. The detected phase delay signal is provided to a reference oscillator difference error correction processor, and total delay difference is measured by subtracting the start delay from the end delay, with the sinewave generator set to the same frequency for the start and end measurements.

Delay drift error is separated from a series of measurements taken between the start and end by subtracting from each measurement an appropriate portion of the total delay difference based upon the proportion of the time of each measurement to the total time.

A preferred method of straightaway envelope delay measurement includes measuring envelope delay by modulating an envelope with a low frequency modulation. The modulated envelope is transmitted. The envelope is detected and the low frequency modulation is recovered from the envelope. Phase of the recovered modulation is compared with phase of a similar low frequency reference. Envelope delay is measured as a difference in phase of the modulation of the detected envelope compared to a local low frequency reference.

The continuous phase drift inherent between the detected envelope and the reference oscillator is managed, accounted for and separated out.

The continuous phase drift includes measuring delay at a start and an end of a series of measurements and determining a total delay difference by subtracting the start delay from the end delay.

Delay drift error is separated out from a series of measurements taken between the start and end measurements by subtracting from each measurement an appropriate portion of a total delay difference based on a proportion of time of each measurement to total time.

These and further and other objects and features of the invention are apparent in the disclosure, which includes the above and ongoing written specification, with the claims and the drawings.

DETAILED DESCRIPTION OF THE PREFERRED EMBODIMENTS

The invention is a returned reference compatible straightaway envelope (group) delay measuring instrument. It is typically used to measure the delay vs. frequency characteristic of telephone facilities which are used for transmission. Straightaway measuring avoids the inconvenience of providing a separate channel for a reference signal which is transmitted to the distant end, then returned to the measuring instrument. Being returned reference compatible enables this straightaway instrument to operate seamlessly as a returned reference instrument when needed.

Figure 1:
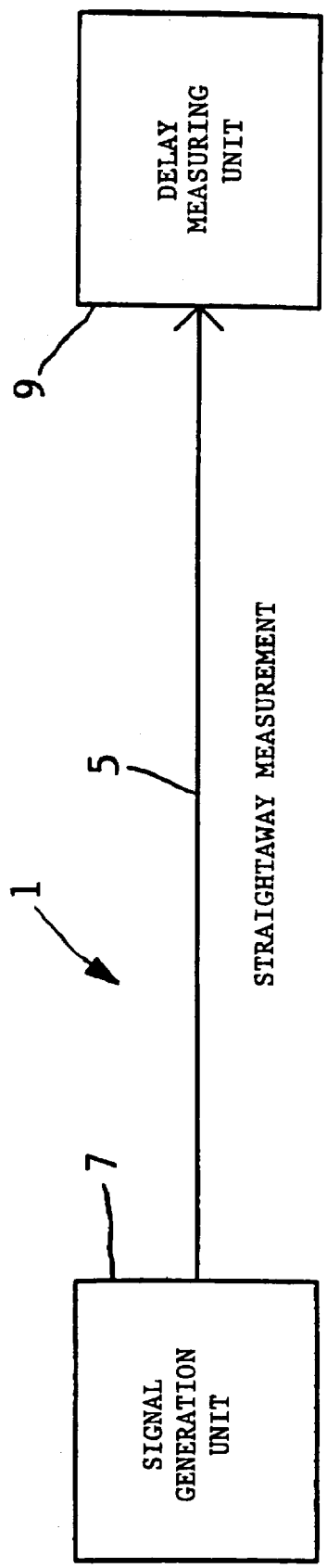
FIG. 1 is a schematic representation of a straightaway measurement.
Figure 2:
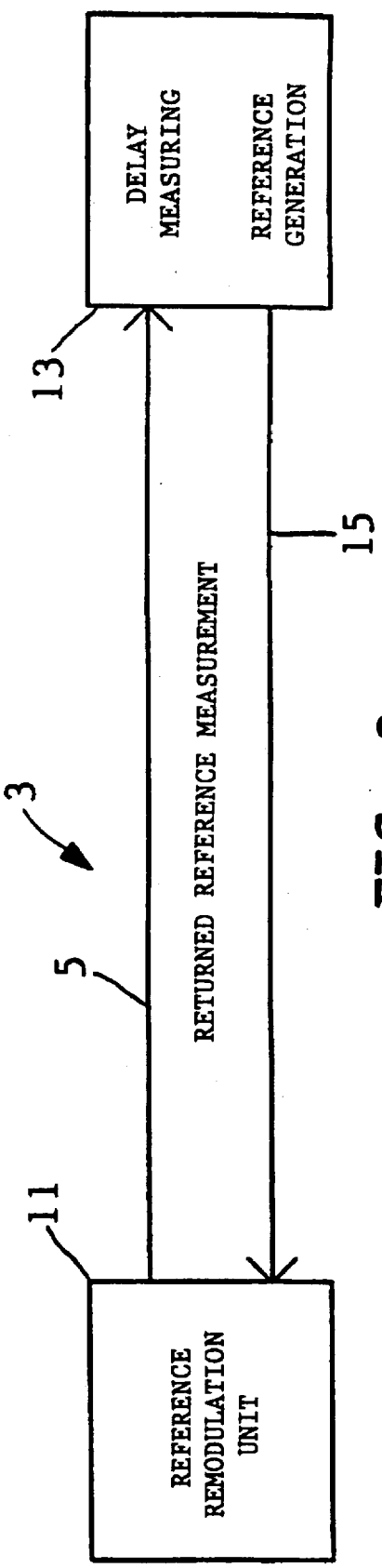
FIG. 2 is a schematic representation of a returned reference measurement.

FIGS. 1 and 2 illustrate the difference between a straightaway measurement 1 of envelope delay along a path 5 and a returned reference measurement 3. In the case of the returned reference measurement 3, a separate path 15 is required to measure the delay characteristic of either of the channels 5 or 15, as shown.

Straightaway measurement 1 measures delay in path 5 using a signal generation unit 7 and a delay measuring unit 9.

There are two forms of returned reference measurements 3 based on which of the two channels 5, 15 is being measured. "Forward Reference Mode" applies when measuring delay in the channel 5 from the remodulation unit 11 to the measuring unit 13. "Return Reference Mode" applies when measuring the channel 15.

Figure 3:
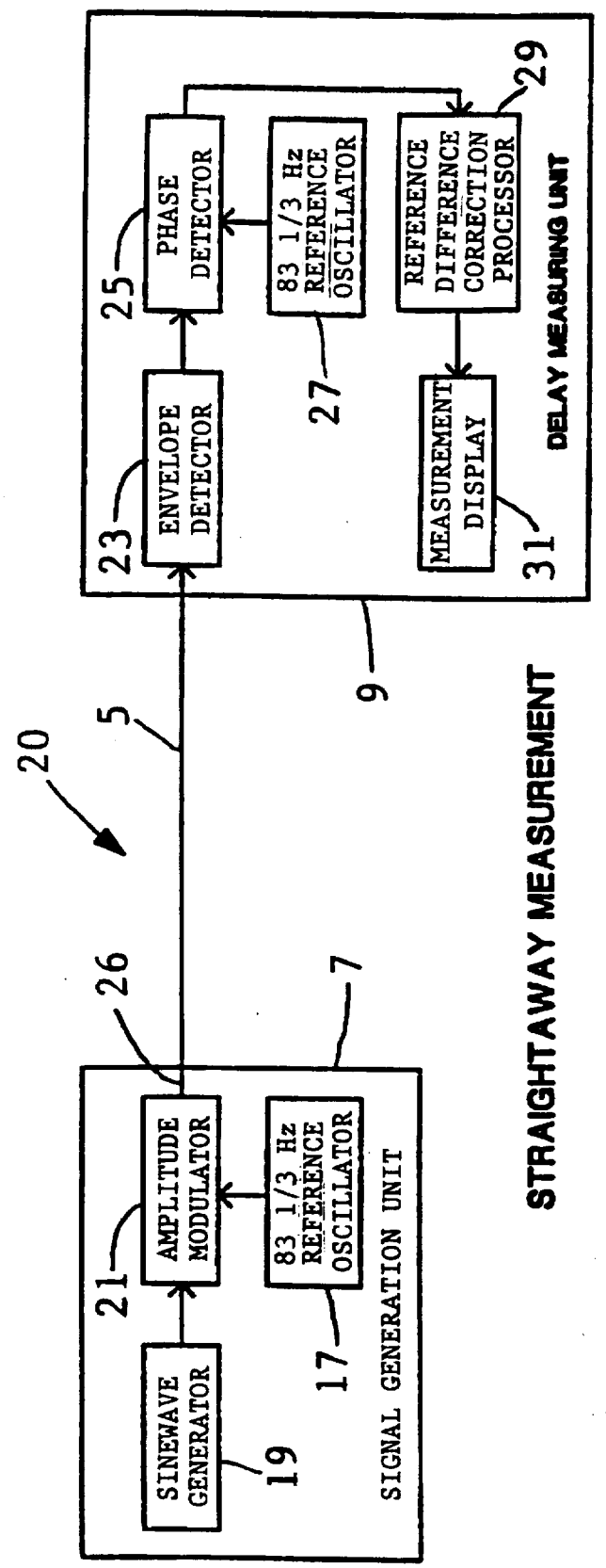
FIG. 3 is a schematic representation of a straightaway delay measurement instrument of the present invention.

As shown in FIG. 3, the returned reference compatible, straightaway envelope delay instruments 20 include the following functional elements sequentially connected (see FIG. 3): a signal generation unit 7 which has an accurate and stable 83⅓ Hz reference oscillator 17, a variable frequency sinewave generator 19, an amplitude modulator 21 and a delay measurement unit 9 which has an envelope detector 23, a phase detector 25, an accurate and stable 83⅓ Hz reference oscillator 27, a reference oscillator difference error correction processor 29, and signal connection, measurement control and display 31.

Figure 4:
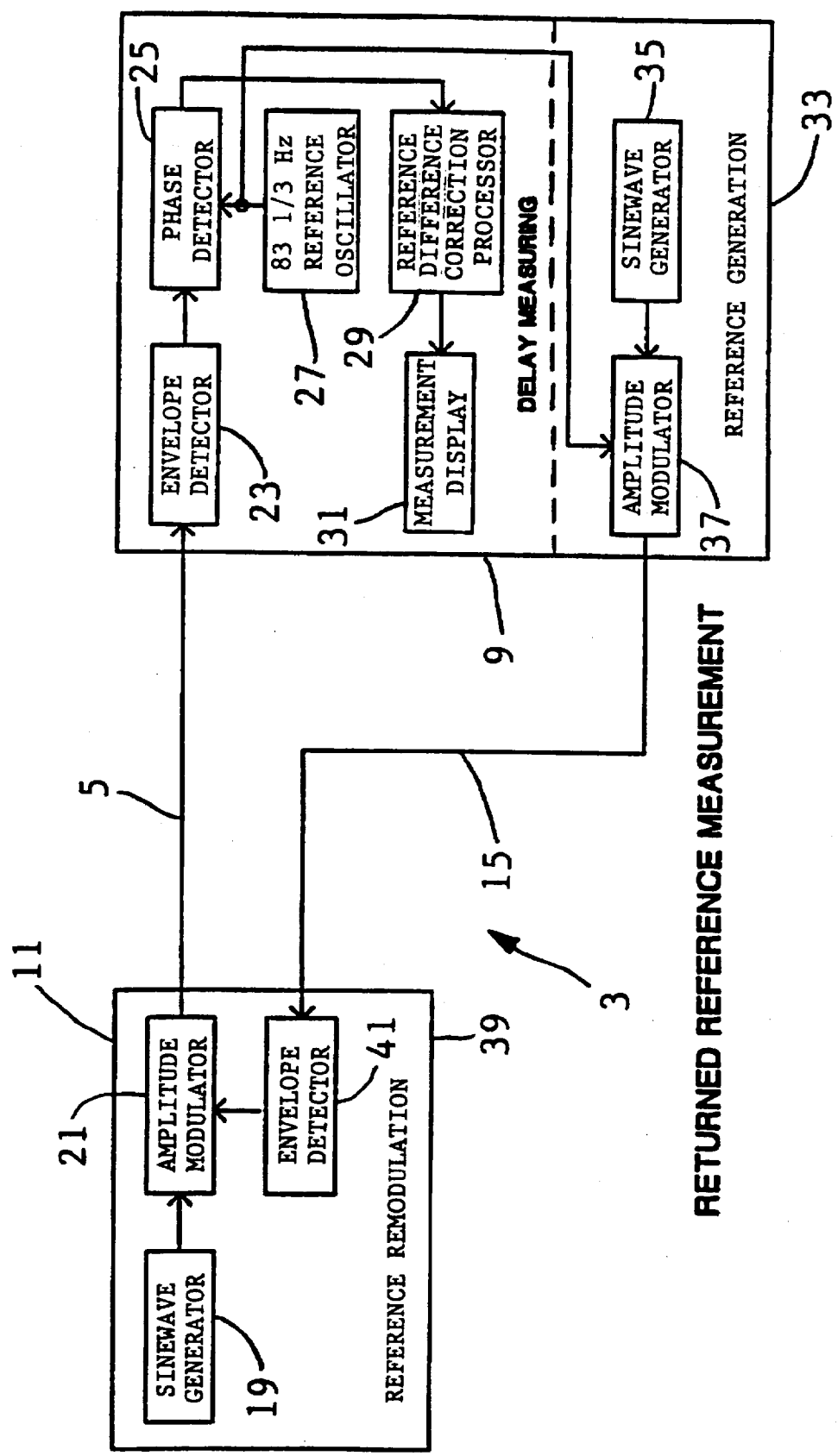
FIG. 4 is a schematic representation of the straightaway delay measurement instrument of the present invention used in returned reference measurement.

As shown in FIG. 4, when used in returned reference measurement 3, the reference generation unit 33 is included in the delay measuring unit 9, which is sequentially connected to other elements. The reference oscillator 27 provides the modulation of the variable frequencies from sinewave generator 35 in amplitude modulator 37.

The modulated signal is provided over channel 15 to the reference remodulation unit 39 and envelope detector 41, which send the modulation signal to supply modulator 21 for modulating the signal from sinewave generator 19.

Returned reference instrument 33 of FIG. 4 measures envelope delay as the difference in phase of the 83⅓ Hz modulation recovered from the received signal compared to the phase of the 83⅓ Hz reference oscillator 27. In straightaway operation of FIG. 3, the present invention measures envelope delay as the difference in phase of 83⅓ Hz reference 17 modulation originating in the signal generating unit 7 compared to that of the 83⅓ Hz reference oscillator 27 in the delay measuring unit 9. That is accomplished by managing, accounting for and separating out the continuous phase drift inherent between the two independent 83⅓ Hz reference oscillators.

The reference oscillator of the present invention is 50 times more accurate than required for returned reference instruments. That is so that straightaway delay measurement drift is held to a manageable 10 uSec drift for each second of passing time.

Figure 5:
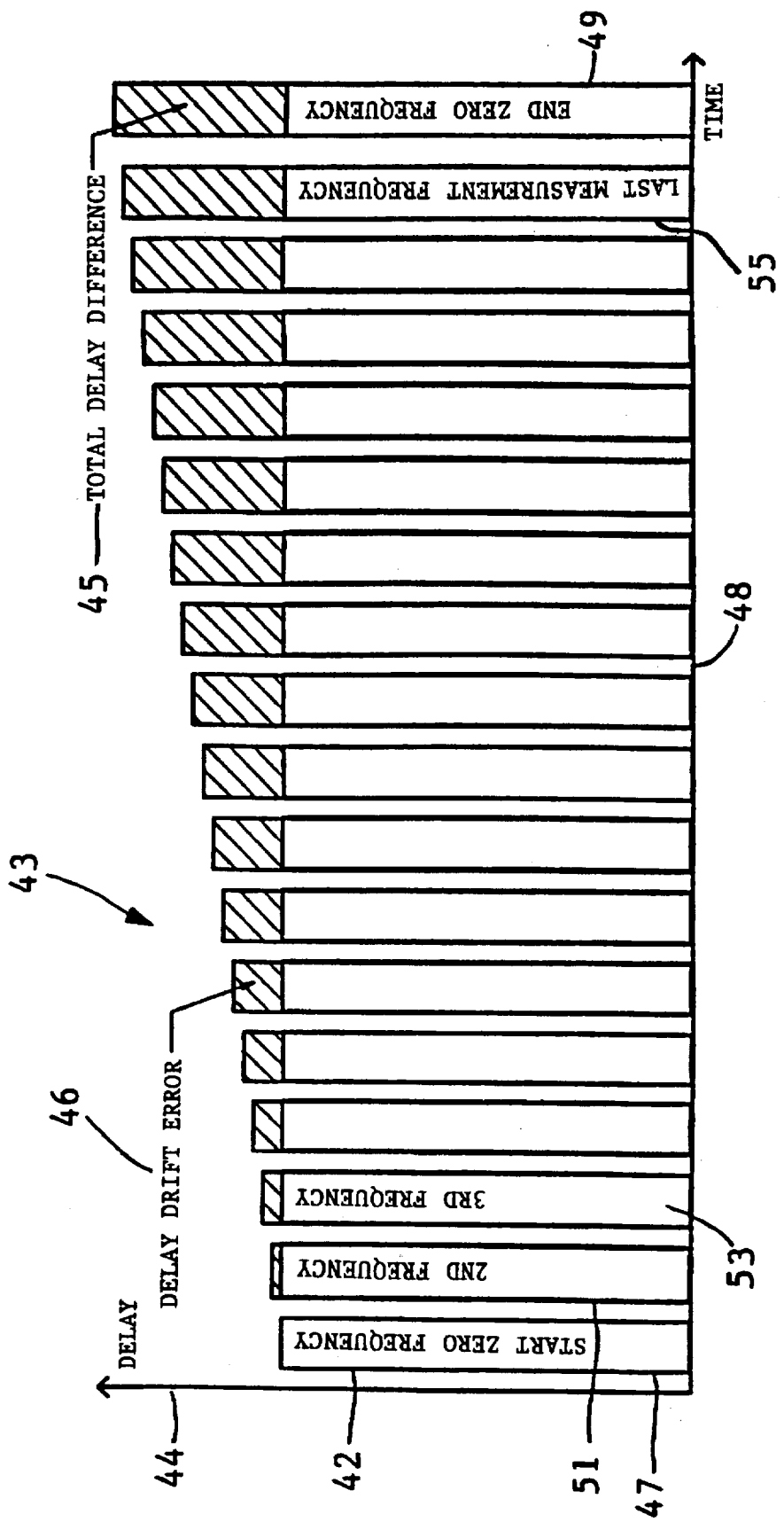
FIG. 5 is a chart showing frequency delay measurements, total delay difference and delay drift error assigned to each frequency measurement

As shown in FIG. 5, envelope delay phase drift 43 is accounted for by simply measuring delay 44 with the sinewave generator set to the same "zero" frequency both at the start and at the end of a series of measurements. Total delay difference 45 is the end delay minus the start delay 42.

Delay drift error 46 is then separated out from the series of measurements taken between the start and end by subtracting from each measurement an appropriate portion of the total delay difference based on the proportion of time 48 of each measurement to the total time.

The reference drift correction processor 29 of this invention computes the total delay difference 45 and delay drift error 46 for each measurement 42–55 and offsets each measurement by the appropriate delay drift error 46. As an example, the signal generation unit 7 sends 1804, 204, 304, ... 1704, 1804 Hz. The delay measuring unit 9 measures and stores a delay reading 42–49 for each frequency. The total delay difference 45 between the start 1804 Hz and the end 1804 Hz is then apportioned: 1/17 to 204 Hz 51, 2/17 to 304 Hz 53 ... 16/17 to 1704 Hz 55, as delay drift error. The apportioned delay drift error is subtracted from each reading 42–55.

As described by way of example herein, the oscillators provide modulation frequencies of 83⅓ Hz. That frequency provides compatability with current measurement techniques. Other suitable frequencies may be employed.

While the invention has been described with reference to specific embodiments, modifications and variations of the invention may be constructed without departing from the scope of the invention, which is defined in the following claims.

I claim:

1. A returned reference compatible, straightaway envelope delay measurement instrument apparatus for measuring delay in a transmission path, comprising a modulation oscillator, a variable frequency sinewave generator and an amplitude modulator connected to the sinewave generator and connected to the modulation oscillator, the amplitude modulator being provided for connecting to the transmission path, an envelope detector for connecting to the transmission path remote from the amplitude modulator, a phase detector connected to the envelope detector, a reference oscillator connected to the phase detector, a reference oscillator difference error correction processor connected to the phase detector, and a measurement display connected to the processor.

2. The apparatus of claim 1, wherein the sinewave generator, the amplitude modulator connected to the sinewave generator and the modulation oscillator connected to the amplitude modulator comprise a signal generation unit, and wherein the envelope detector, the phase detector, the reference oscillator, the reference oscillator difference error correction processor and the measurement display comprise a delay measuring unit.

3. The apparatus of claim 2, wherein the signal generation unit is connected to a first end of the transmission path and the envelope detector is connected to the second end of the transmission path.

4. The apparatus of claim 2, the modulation oscillator further comprising a reference generation unit having a second sinewave generator and a second amplitude modulator connected to the reference oscillator and to a second path, and having a second envelope detector in a reference remodulation unit having the first sinewave generator and the first amplitude modulator, the second envelope detector connected to the first amplitude modulator, the first and second amplitude modulators and the first and second envelope detectors being connected respectively via the first and second transmission paths.

5. The apparatus of claim 4, wherein the delay measuring unit and reference generation unit are mounted together.

6. The method of delay measurement, comprising creating a sinewave signal in a sinewave generator, creating a first lower frequency modulation oscillation signal in a low frequency modulation oscillator, modulating the sinewave signal with the low frequency oscillation, providing the modulated sinewave signal on a transmission path, detecting the modulated sinewave signal with an envelope detector remotely mounted in a delay measuring unit on the transmission path, providing a second low frequency reference oscillation signal and detecting phase difference between the first low frequency modulation oscillation signal from the envelope detector and the second low frequency reference oscillation signal, providing the detected phase delay signal to a reference oscillator difference error correction processor, and measuring total delay difference by subtracting a start delay from an end delay where the start and end frequencies of the sinewave generator are the same.

7. The method of claim 6, further comprising determining and separating delay drift error from a series of measurements taken between the start and end by subtracting from each measurement an appropriate portion of the total delay difference based upon the proportion of the time of each measurement to the total time difference between the start and end measurement.

8. The method of straightaway envelope delay measurement, comprising measuring envelope delay by modulating a signal having an envelope with a low frequency modulation, transmitting the modulated envelope, signal detecting the envelope and recovering the low frequency modulation from the envelope, comparing phase of the recovered modulation with phase of a similar low frequency reference signal from a reference oscillator, and measuring envelope delay as a difference in phase of the modulation of the detected envelope compared to the low frequency reference.

9. The method of claim 8, further comprising managing, accounting for and separating out of a continuous phase drift inherent between the envelope modulation and the reference.

10. The method of claim 9, wherein separating the continuous phase drift comprises measuring delay at a common start and end frequency of a series of measurements and determining a total delay difference by subtracting the start delay from the end delay.

11. The method of claim 10, further comprising separating out delay drift error from a series of measurements taken between the start and end measurements by subtracting from each measurement an appropriate portion of a total delay difference based on a proportion of time of each measurement to total time difference between the start and end measurement.

12. A returned reference compatible, straightaway envelope delay measurement instrument apparatus for measuring delay in a transmission path, comprising a modulation source, a variable frequency sinewave generator and an amplitude modulator connected to the sinewave generator and connected to the modulation source, the amplitude modulator being provided for connecting to the transmission path, an envelope detector for connecting to the transmission path remote from the amplitude modulator, a phase detector connected to the envelope detector, a reference oscillator connected to the phase detector, a reference oscillator difference error correction processor connected to the phase detector, and a measurement display connected to the processor.

13. The apparatus of claim 12, wherein the modulation source comprises a reference oscillator, wherein the sinewave generator, the amplitude modulator connected to the sinewave generator and the reference oscillator connected to the amplitude modulator comprise a signal generation unit, and wherein the envelope detector, the phase detector, the reference oscillator, the reference oscillator difference error correction processor and the measurement display comprise a delay measuring unit.

14. The apparatus of claim 13, wherein the signal generation unit is connected to a first end of the transmission path and the envelope detector is connected to the second end of the transmission path.

15. The apparatus of claim 12, wherein the said amplitude modulator comprises a first amplitude modulator, wherein the signal generator comprises a first signal generator, and further comprising a second path and a reference generation unit having a second sinewave generator and a second amplitude monitor connected to the reference oscillator, to the second sinewave generator and to the second path, a second envelope detector connected to the second amplitude modulator, the first and second amplitude modulators and the first and second envelope detectors being respectively connected via the first and second transmission paths.

16. The apparatus of claim 15, wherein the first envelope detector, the reference generator, the phase detector, the processor and the display comprise the delay measuring unit, which with the reference generation unit are mounted together, and wherein the second envelope detector, first sinewave generator and first amplitude modulator comprise a reference remodulation unit.

17. The method of delay measurement, comprising creating a sinewave signal in a sinewave generator, providing a first low frequency modulation oscillation signal from a low frequency modulation source, modulating the sinewave signal with the low frequency oscillation, providing the modulated sinewave signal on a transmission path, detecting the modulated sinewave signal with an envelope detector remotely mounted in a delay measuring unit on the transmission path, providing a second low frequency reference oscillation signal and detecting phase difference between the first low frequency modulation oscillation signal from the envelope detector and the second low frequency reference oscillation signal, providing the detected phase delay signal to a reference oscillator difference error correction processor, and measuring total delay difference by subtracting the start delay from the end delay where the start and end frequencies of the sinewave generator are the same.

18. The method of claim 17, further comprising separating delay drift error from a series of measurements taken between the start and end by subtracting from each measurement an appropriate portion of the total delay difference based upon the proportion of the time of each measurement to the total time difference between the start and end measurement.

19. The method of straightaway envelope delay measurement, comprising measuring envelope delay by providing a first sinewave, amplitude modulating the first sinewave with a first low frequency modulation, transmitting the first modulated sinewave, receiving the first modulated sinewave, detecting and recovering the first low frequency modulation from the first modulated sinewave, comparing phase of the recovered modulation with phase of a second low frequency reference signal from a reference oscillator, and measuring envelope delay as a difference in phase of the detected modulation compared to the second low frequency reference signal.

20. The method of claim 19, further comprising managing, accounting for and separating out a continuous phase drift inherent between the first modulation and the reference signal.

21. The method of claim 20, wherein separating the continuous phase drift comprises measuring delay at common start and end frequencies of a series of measurements and determining a total delay difference by subtracting the start delay from the end delay.

22. The method of claim 21, further comprising separating out delay drift error from a series of measurements taken between the start and end measurements by subtracting from each measurement an appropriate portion of a total delay difference based on a proportion of time of each measurement to total time difference between the start and end measurement.

* * * * *